US012763144B2

(12) United States Patent
Ryoo

(10) Patent No.: US 12,763,144 B2
(45) Date of Patent: Oct. 13, 2026

(54) WORD LINE DECODER, CONTROL METHOD OF MEMORY DEVICE AND WORD LINE DRIVE CIRCUIT

(71) Applicant: Winbond Electronics Corp., Taichung City (TW)

(72) Inventor: Pil-Sang Ryoo, Hsinchu (TW)

(73) Assignee: Winbond Electronics Corp., Taichung City (TW)

( * ) Notice: Subject to any disclaimer, the term of this patent is extended or adjusted under 35 U.S.C. 154(b) by 110 days.

(21) Appl. No.: 18/822,314

(22) Filed: Sep. 2, 2024

(65) Prior Publication Data

US 2026/0065994 A1 Mar. 5, 2026

(51) Int. Cl.

*G11C 11/00* (2006.01)
*G11C 16/08* (2006.01)
*G11C 16/14* (2006.01)
*G11C 16/30* (2006.01)

(52) U.S. Cl.

CPC .............. *G11C 16/08* (2013.01); *G11C 16/14* (2013.01); *G11C 16/30* (2013.01)

(58) Field of Classification Search

CPC .......... G11C 16/08; G11C 16/04; G11C 16/30
See application file for complete search history.

(56) References Cited

U.S. PATENT DOCUMENTS 5,856,944 A * 1/1999 Prickett, Jr. ........ G11C 16/3404 365/185.29
6,166,961 A * 12/2000 Lee ........................ G11C 5/145 365/185.29
6,388,472 B1 5/2002 Kang
8,189,396 B2 5/2012 Chen et al.
2010/0182834 A1* 7/2010 Lin ...................... G11C 7/1048 365/185.11
2022/0130460 A1 4/2022 Yang

* cited by examiner

*Primary Examiner* — Pho M Luu
(74) *Attorney, Agent, or Firm* — JCIPRNET

(57) ABSTRACT

A word line decoder is provided. The word line decoder includes a word line drive circuit including a first and a second drive transistor. A first terminal of the first drive transistor receives a first signal, and a control terminal of the first drive transistor receives a first control signal. The second drive transistor is coupled to the first drive transistor, a second terminal of the second drive transistor receives a revised global word line voltage, and a control terminal of the second drive transistor receives a global word line voltage. The first terminal of the second drive transistor and the second terminal of the first drive transistor are coupled to a gate terminal of a cell in a memory array. In an erase operation and the cell is not selected for erase, the first signal is a Hi-Z state and coupled to the gate terminal of the cell.

19 Claims, 9 Drawing Sheets

WORD LINE DECODER, CONTROL METHOD OF MEMORY DEVICE AND WORD LINE DRIVE CIRCUIT

BACKGROUND

Technical Field

The disclosure relates to erase operation techniques for memory devices, and more particularly, to a word line decoder, a control method of a memory device, and a word line drive circuit.

Description of Related Art

A flash memory device is consisted of a plurality of cell array blocks. These cell array blocks may share a common P-well layer in the flash memory device. For instance, the flash memory device may have 4096 bit lines and 512 word lines in a single common P-well layer of cell array blocks. Since several cell array blocks or sectors share the common P-well layer, while an erase flow algorithm of the flash memory device is performed, deselected cell array blocks/sectors may loss charge by a P-well bias voltage of the common P-well layer. For dealing with the problem with charge loss through the common P-well layer, it may perform a refresh step in the erase flow algorithm for moving the threshold voltage of the disturbed cells to original target threshold voltage area for recovering these disturbed bits. However, the refresh step may occupy not a short time, and it may create extra program disturb as well as cell degradation according to hot electron injection (HEI).

SUMMARY

The disclosure is directed to a word line decoder and a control method of a memory device, an operation time period of an erase flow algorithm can be reduced and saved, the drain stress of a deselected cell in the memory device is reduced, and it results in better endurance for the cells in the memory device.

The disclosure provides a word line decoder. The word line decoder includes a word line drive circuit. The word line drive circuit includes a first drive transistor and a second drive transistor. A first terminal of the first drive transistor receives a first signal, and a control terminal of the first drive transistor receives a first control signal. A first terminal of the second drive transistor is coupled to a second terminal of the first drive transistor, a second terminal of the second drive transistor receives a revised global word line voltage, and a control terminal of the second drive transistor receives a global word line voltage. The first terminal of the second drive transistor and the second terminal of the first drive transistor are coupled to a gate terminal of one of a plurality of cells in a memory array. In an erase operation and the one of the plurality of cells is not selected for erase, the first control signal is enabled to enable the first transistor, the first signal is a Hi-Z state, and the first signal is coupled to the gate terminal of the one of the plurality of cells through the first drive transistor.

The disclosure provides a control method of a memory device, wherein the memory device includes a plurality of cells. The method comprising: in an erase operation, in which one of the cells as a selected cell is selected for erase, a word line voltage coupled to a gate terminal of the selected cell is a preset negative voltage; and, in which one of the cells as a deselected cell is not selected for erase, a word line voltage coupled to a gate terminal of the deselected cell is a Hi-Z state.

The disclosure provides a word line drive circuit. The word line drive circuit includes a first drive transistor and a second drive transistor. A first terminal of the first drive transistor receives a first signal, and a control terminal of the first drive transistor receives a first control signal. A first terminal of the second drive transistor is coupled to a second terminal of the first drive transistor, a second terminal of the second drive transistor receives a revised global word line voltage, and a control terminal of the second drive transistor receives a global word line voltage. The first terminal of the second drive transistor and the second terminal of the first drive transistor are coupled to a gate terminal of one of a plurality of cells in a memory array. In an erase operation and the one of the plurality of cells is not selected for erase, the first control signal is enabled to enable the first transistor, the first signal is a Hi-Z state, and the first signal is coupled to the gate terminal of the one of the plurality of cells through the first drive transistor.

Based on the above description, in a situation that the word line voltage of the deselected cell(s) is the Hi-Z state while the selected cell(s) is erased in the erase operation, it has no current or carriers flow through the corresponding deselected cell(s) in the memory device. Thus, a threshold voltage distribution of the deselected cell(s) does not been affected and also not moved in the erase operation, the refresh step in an erase flow algorithm for moving the threshold voltage of the disturbed cells is no need to be performed, and the operation time period of the erase flow algorithm can be reduced and saved. Further, the drain stress of deselected cell is reduced and it results in better endurance for the cells in the memory device.

DESCRIPTION OF THE EMBODIMENTS

Figure 1:
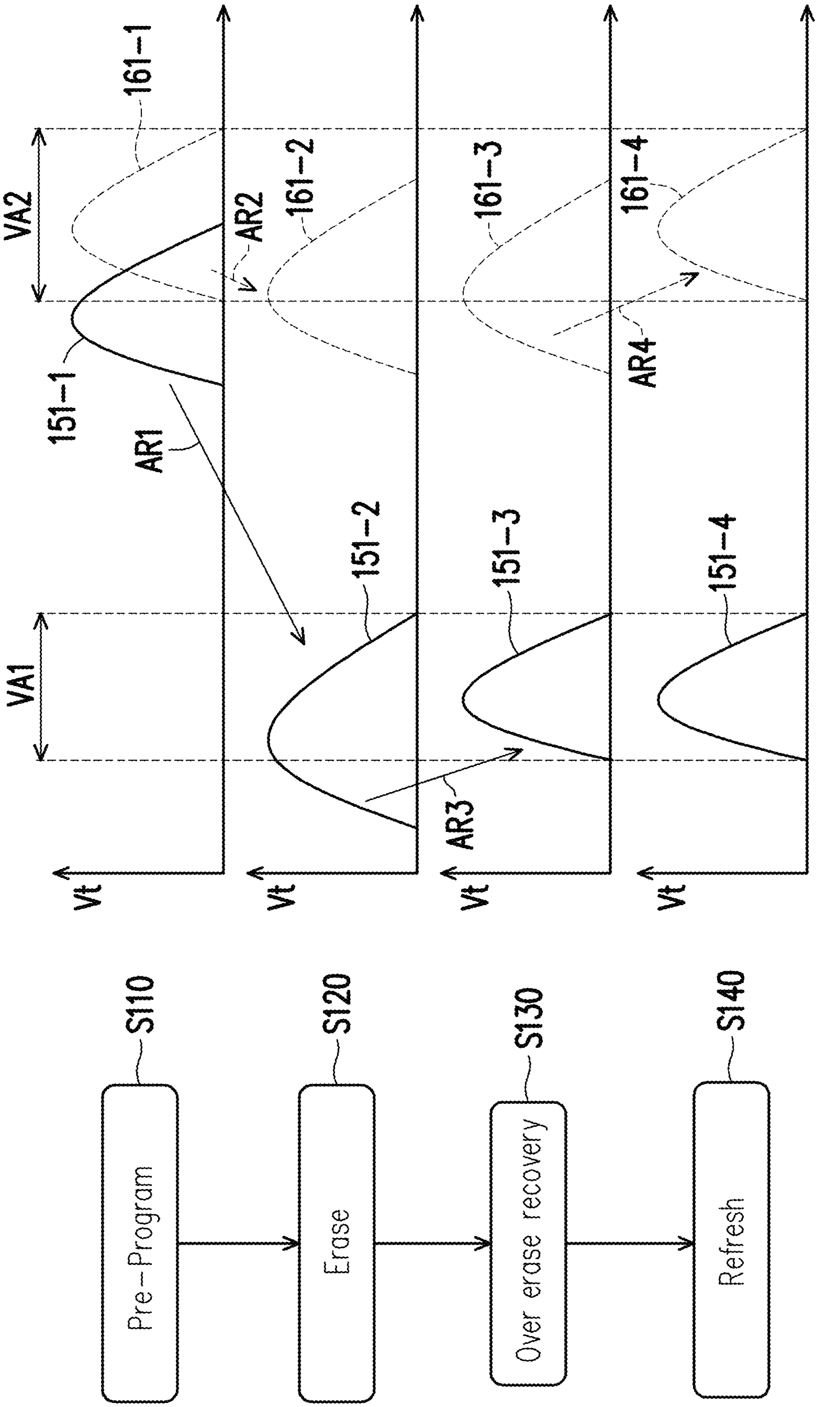
FIG. 1 illustrates threshold voltage distributions of a selected bit and a deselected bit with a common P-well layer in different steps of an erase flow algorithm according to a disclosure.

FIG. 1 illustrates a flow chart with an erase flow algorithm and threshold voltage distributions of a selected bit and a deselected bit with a common P-well layer shown in different steps of the erase flow algorithm according to a disclosure. The erase flow algorithm according to the disclosure includes four steps in FIG. 1: a pre-program step S110, an erase step S120, an over erase recovery step S130, and a refresh step S140. The selected cell in a flash memory device is selected for performing the erase flow algorithm, and deselected cells in the flash memory device are affected by the erase flow algorithm.

In detail, in the pre-program step S110, threshold voltage distributions of the selected cell and one of the deselected cells in a flash memory device are presented on the right side of FIG. 1. The distribution 151-1 indicates the threshold voltage distribution of the selected cell, and the distribution 161-1 indicates the threshold voltage distribution of the deselected cell. In the erase step S120, the selected cell is erased, but the un-select cells are disturbed and affected inevitably because the selected cell and the deselected cells have the common P-well layer. The threshold voltage distribution 151-2 of the selected cell is roughly moved to the target voltage area VA1 for the erase step 120 (see an arrow AR1). In the other hand, the threshold voltage distribution 161-2 of the deselected cell is disturbed and moved slightly for losing some charge in the deselected cell, thus not all of the threshold voltage distribution 161 is in an original voltage area VA2 (see an arrow AR2). After the erase step S120, the threshold voltage distribution 151-2 is not actually in the target voltage area VA1, and parts of the threshold voltage distribution 161-2 is out of the original voltage area VA2, thus the steps S130-S140 are performed for adjusting the distributions 151-2 and 161-2.

In the over erase recovery step S130, the threshold voltage distribution 151-3 of the selected cell is adjusted to move in to the voltage area VA1 (see an arrow AR3) for recovery, and the threshold voltage distribution 161-3 of the deselected cell is not moved. And, in the refresh step S140, the threshold voltage distribution 161-4 of the deselected cell is adjusted to move back to the original voltage area VA2 (see an arrow AR4), and the threshold voltage distribution 151-4 of the deselected cell is not moved. Thus, the erase flow algorithm is finished in FIG. 1 through the steps S110-S140. However, the refresh step S140 may occupy not a short time, and if the erase flow algorithm for the selected cell does not affect the deselected cells based on the common P-well layer, the refresh step S140 does not need to be implemented.

Figure 2:
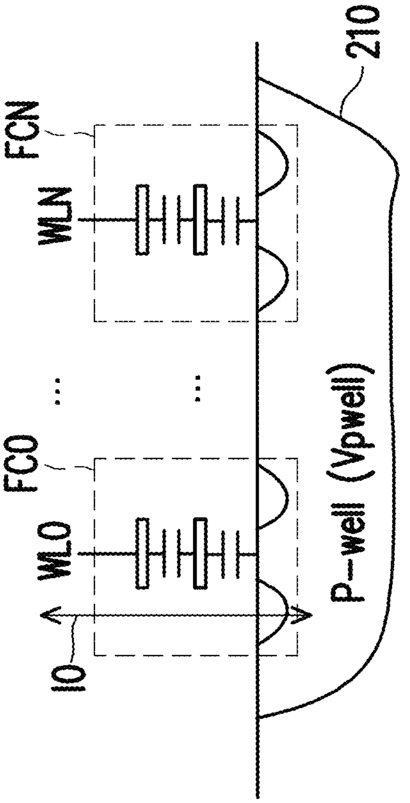
FIG. 2 is a circuit diagram of a word line driver in a word line decoder array according to an embodiment of the present invention.

FIG. 2 is a schematic diagram of cells FC0-FCN in the memory device according to an embodiment of the present invention. The cells FC0-FCN are set on a common p-well layer 210. The common p-well layer 210 has a P-well bias voltage Vpwell. Each of the gate terminal of the cells FC0-FCN receives a word line voltage on each of the word lines WL0-WLN respectively. The movement of threshold voltage distributions with cells in the memory device is based on current I0 or carriers (i.e., electronics) flow through corresponding cells. If there is no current I0 or carriers flow through corresponding cells, threshold voltage distributions with these cells are not moved. Thus, if it is not desired that the threshold voltage distributions of the cell are affected for moving while the cell is deselected, no current or carriers flow through these deselected cells for erase may be implemented according to an embodiment of the present invention.

Figure 3:
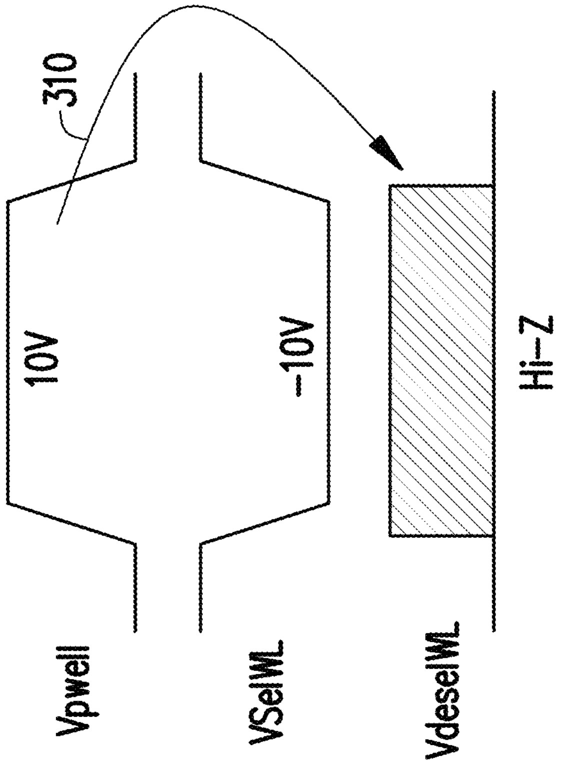
FIG. 3 is a simplified signal schematic diagram for illustrating the P-well bias voltage Vpwell and the word line voltages for selected cells and deselected cells according to an embodiment of the present invention.

FIG. 3 is a simplified signal schematic diagram for illustrating the P-well bias voltage Vpwell and the word line voltages for selected cells and deselected cells according to an embodiment of the present invention. In FIG. 3, the P-well bias voltage Vpwell of the common p-well layer 210 of FIG. 2 may be a high voltage (for instance, 10V). In order to no current or carriers flow through the deselected cells according to the common p-well layer while the selected cell(s) is erased, in a step of the erase flow algorithm for providing the word line voltages to the cells, the word line voltage for the selected cells (i.e., a selected word line voltage VSelWL) is a fixed voltage (for instance, −10V), and the word line voltage for the deselected cells (i.e., a deselected word line voltage VdeSelWL) is a Hi-Z state (i.e., a floating state). Because of the Hi-Z state with the deselected word line voltage VdeSelWL while the selected cell(s) is erased, it has no current or carriers flow through the corresponding deselected cells in the memory device (shown as an arrow 310), thus the threshold voltage distributions of the deselected cells are not affected and also not moved, the refresh step S140 in FIG. 1 is no need for implementing, and the operation time period of the erase flow algorithm can be reduced and saved. Further, the drain stress of deselected cell is reduced and it results in better endurance for the cells in the memory device.

Figure 4:
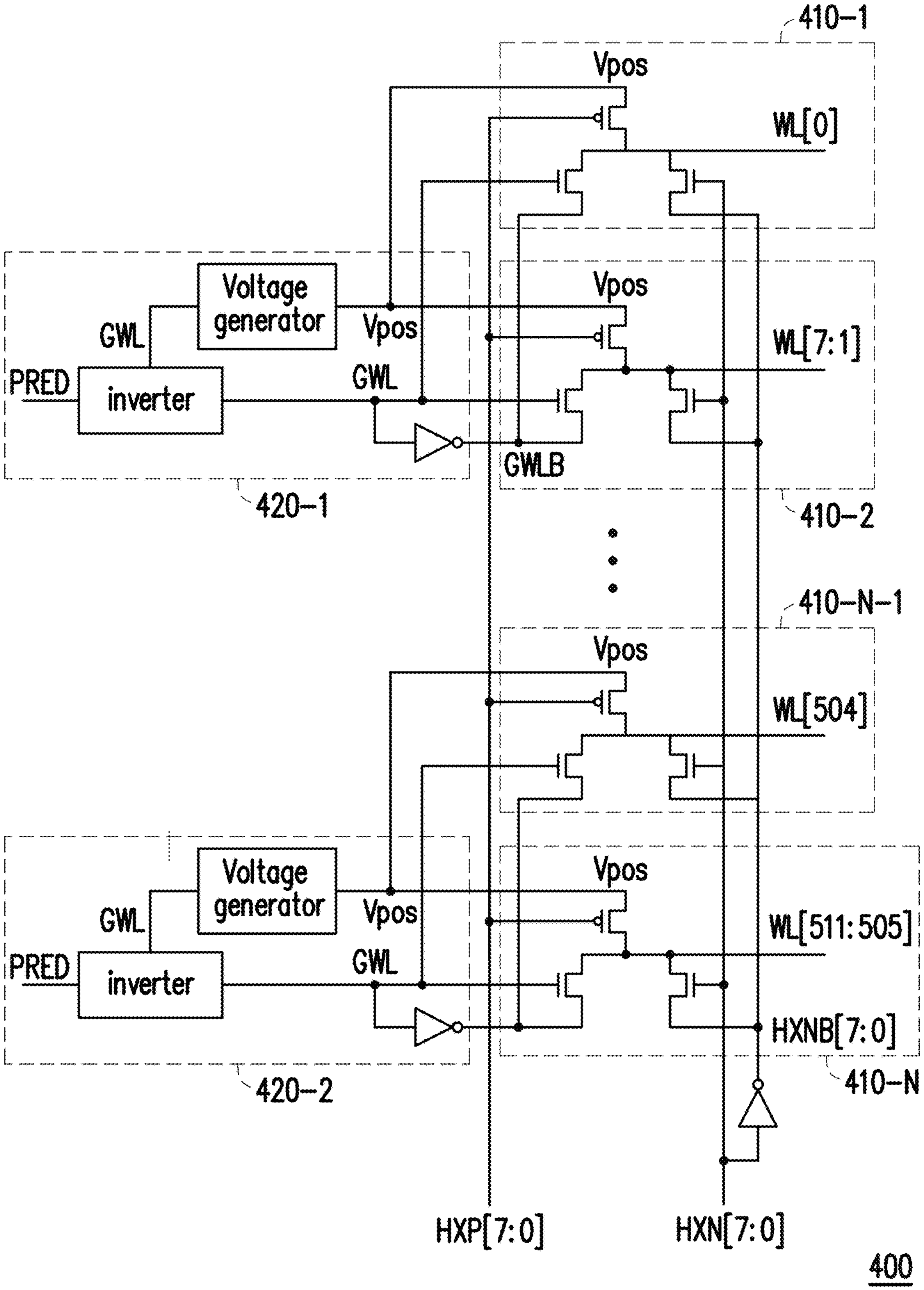
FIG. 4 is a circuit diagram for illustrating a word line decoder 400 according to an embodiment of the present invention.

FIG. 4 is a circuit diagram for illustrating a word line decoder 400 according to an embodiment of the present invention. The word line decoder 400 is implemented in a memory device (for instance, a NOR flash memory device). The memory device has a memory array consisted of a plurality of cells and other circuits for operating the memory array (for example, a word line decoder).

The word line decoder 400 in FIG. 4 includes at least one word line drive circuit. For example, multiple word line drive circuits 410-1 to 410-N are in the word line decoder 400 of FIG. 4. The word line decoder 400 further includes at least one global word line decoder. For example, two global word line decoders 420-1 to 420-2 are in the word line decoder 400 of FIG. 4. The global word line decoders 420-1 to 420-2 provides a global word line voltage GWL, a revised global word line voltage GWLB, and a first voltage Vpos to the word line drive circuits 410-1 to 410-N. For example, the word line drive circuit 410-1 in FIG. 4 provides a world line voltage WL[0] to corresponding cell, the word line drive circuit 410-1 provides world line voltages WL[7:1] to corresponding cells, the word line drive circuit 410-N-1 provides world line voltage WL[504] to corresponding cell, and the word line drive circuit 410-1 provides world line voltages WL[511:505] to corresponding cells. Circuit details of the word line drive circuits 410-1 to 410-N (take the word line drive circuit 410-1 as example) shown in FIG. 5, and circuit details of the global word line decoders 420-1 to 420-2 (take the global word line decoders 420-1 as example) shown in FIG. 6.

Figure 5:
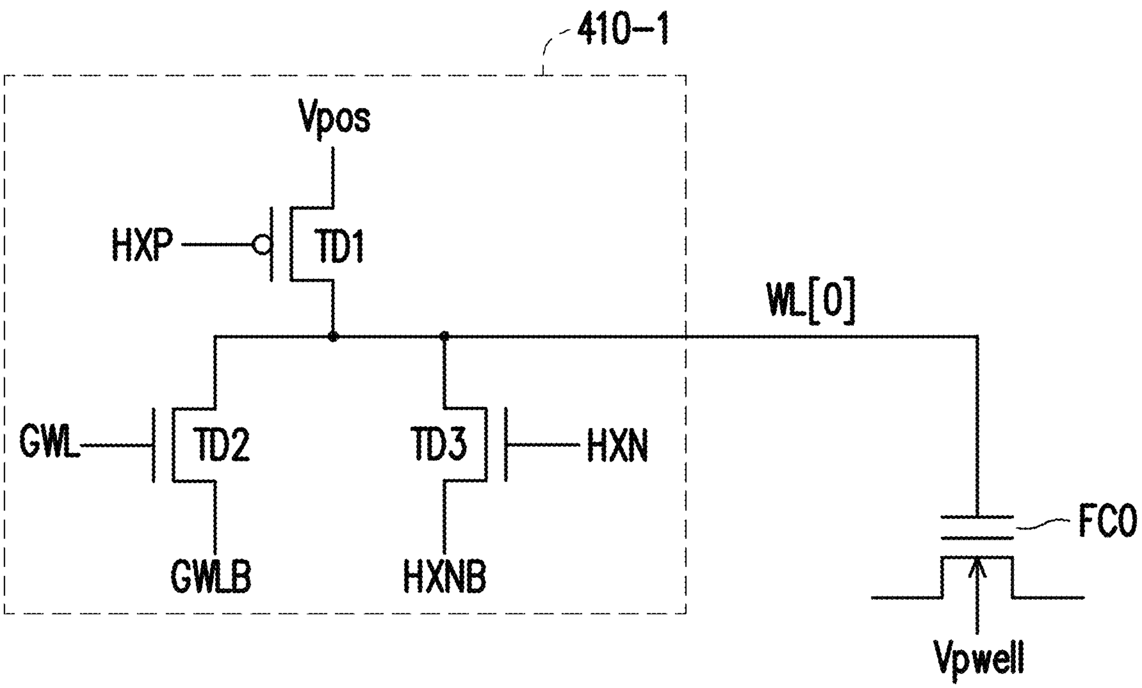
FIG. 5 is a circuit diagram for illustrating a word line drive circuit (e.g., the word line drive circuit 410-1) in the word line decoder 400 of FIG. 4 according to an embodiment of the present invention.

FIG. 5 is a circuit diagram for illustrating a word line drive circuit (e.g., the word line drive circuit 410-1) in the word line decoder 400 of FIG. 4 according to an embodiment of the present invention. The word line drive circuit 410-1 is taken as example. The word line drive circuit 410-1 in FIG. 5 includes a first drive transistor TD1 and a second drive transistor TD2. The first terminal (a source terminal) of the first drive transistor TD1 receives a first signal Vpos, and a control terminal (a gate terminal) of the first drive transistor TD1 receives a first control signal HXP. A first terminal (a drain terminal) of the second drive transistor TD2 is coupled to a second terminal (a drain terminal) of the first drive transistor TD1, a second terminal (a source terminal) of the second drive transistor TD2 receives a revised global word line voltage GWLB, and a control terminal (a gate terminal) of the second drive transistor TD2 receives a global word line voltage GWL. The first terminal (the drain terminal) of the second drive transistor TD2 and the second terminal (the drain terminal) of the first drive transistor TD1 are coupled to a gate terminal of a cell FCN in the memory array. In other words, the drain terminal of the second drive transistor TD2 and the drain terminal) of the first drive transistor TD1 are coupled to an output terminal of the word line drive circuit 410-1 for providing a word line voltage (i.e., the word line voltage WL[0]) to the gate terminal of the cell FC0.

The word line drive circuit 410-1 in FIG. 5 further includes a third drive transistor TD3. A first terminal (a drain terminal) of the third drive transistor TD3 is coupled to the second terminal (a drain terminal) of the first drive transistor TD1 and the output terminal of the word line drive circuit 410-1. A control terminal (a gate terminal) of the third drive transistor TD3 receives a second control signal HXN, and the second terminal (a source terminal) of the third drive transistor TD3 receives a revised second control signal HXNB. The cell FC0 is set on the common P-well layer, and the common P-well layer has the P-well bias voltage Vpwell. The first drive transistor TD1 is a P-type transistor, and the second drive transistor TD2 and the third drive transistor TD3 are N-type transistors. In an erase operation and the cell FC0 is not selected for erase, the first control signal HXP is enabled (e.g., the first control signal HXP is 0V) to enable the first drive transistor TD1, the first signal Vpos is a Hi-Z state, and the first signal Vpos is coupled to the gate terminal of the cell Vpwell through the first drive transistor TD1. Thus, in the erase operation and the cell FC0 as a deselected cell is not selected for erase, no current flows through the cell FC0 with the common P-well layer while the first signal Vpos is coupled to the gate terminal of the cell FC0.

Figure 6:
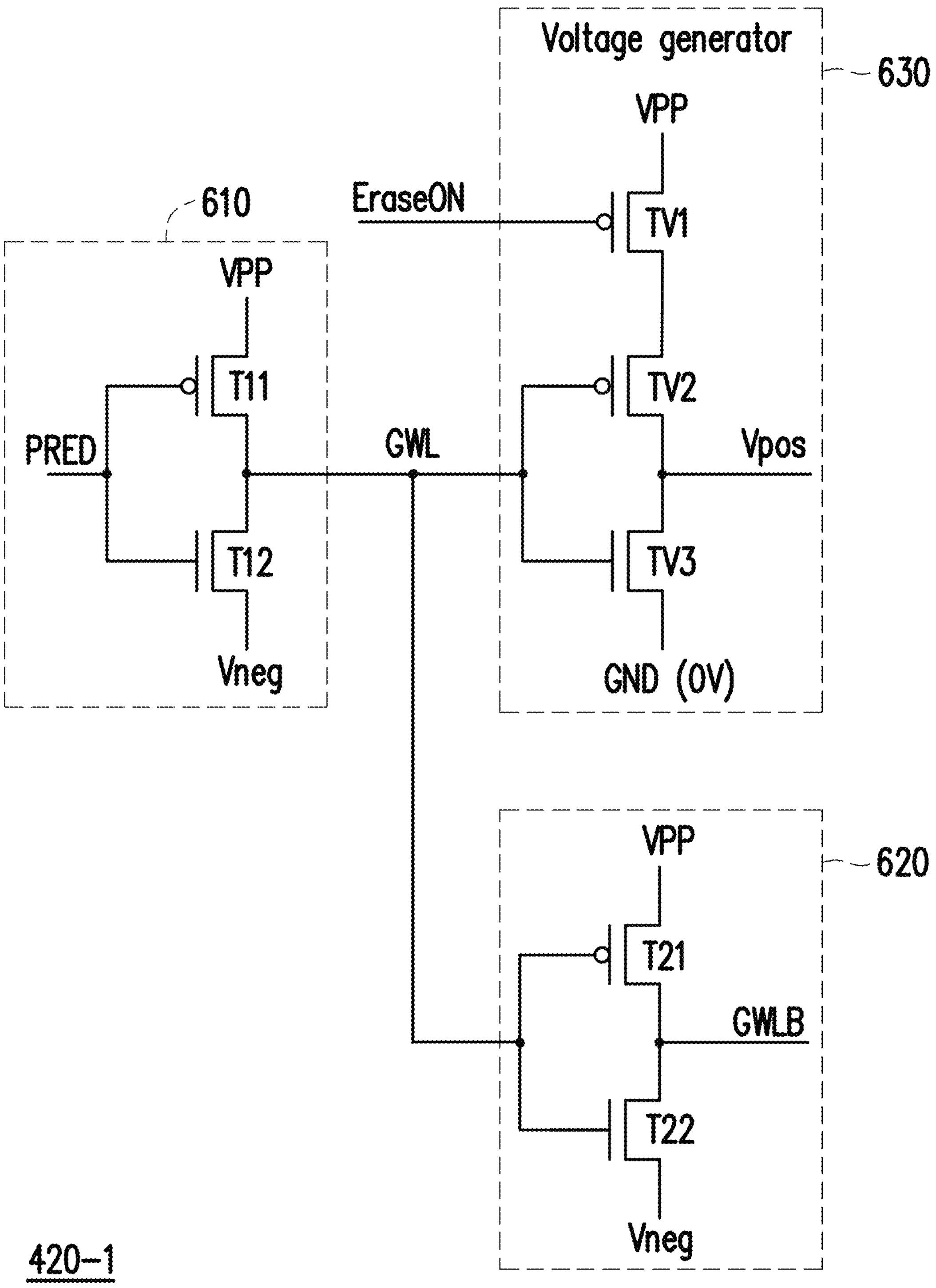
FIG. 6 is a circuit diagram for illustrating a global word line decoder (e.g., the global word line decoder 420-1) in the word line decoder 400 of FIG. 4 according to an embodiment of the present invention.

FIG. 6 is a circuit diagram for illustrating a global word line decoder (e.g., the global word line decoder 420-1) in the word line decoder 400 of FIG. 4 according to an embodiment of the present invention. The global word line decoder 420-1 includes a first inverter 610, a second inverter 620, and a voltage generator 630.

The input terminal of the first inverter 610 receives a global control signal PRED. A system voltage terminal of the first inverter 610 receives a system voltage VPP (e.g., the system voltage VPP may be 2V), a ground terminal of the first inverter 610 receives a negative voltage Vneg (e.g., the negative voltage Vneg may be −10V), and an output terminal of the first inverter 610 provides the global word line voltage GWL. In detail, the first inverter 610 includes a P-type transistor T11 and a N-type transistor T12. The first terminal (the source terminal) of the P-type transistor T11 is the system voltage terminal of the first inverter 610. The control terminals (the gate terminals) of the P-type transistor T11 and the N-type transistor T12 receive the global control signal PRED. The second terminal (the drain terminal) of the P-type transistor T11 and the first terminal (the drain terminal) of the N-type transistor T12 are coupled as the output terminal of the first inverter 610 for providing the global word line voltage GWL. The second terminal (the source terminal) of the N-type transistor T12 is the ground terminal of the first inverter 610.

An input terminal of the second inverter 620 receives the global word line voltage GWL, a system voltage terminal of the second inverter 620 receives the system voltage VPP, a ground terminal of the second inverter 620 receives the negative voltage Vneg, and an output terminal of the second inverter 620 provides the revised global word line voltage GWLB. In detail, the second inverter 620 includes a P-type transistor T21 and a N-type transistor T22. The first terminal (the source terminal) of the P-type transistor T21 is the system voltage terminal of the second inverter 620. The control terminals (the gate terminals) of the P-type transistor T21 and the N-type transistor T22 receive the global word line voltage GWL. The second terminal (the drain terminal) of the P-type transistor T21 and the first terminal (the drain terminal) of the N-type transistor T22 are coupled as the output terminal of the second inverter 620 for providing the revised global word line voltage GWLB. The second terminal (the source terminal) of the N-type transistor T22 is the ground terminal of the second inverter 620. The source terminal of the P-type transistor T21 is the system voltage not the negative voltage Vneg, so that it can reduces a body bias effect of the P-type transistor T21.

The voltage generator 630 is coupled to the first inverter 610 for providing the first signal Vpos according to the global word line voltage GWL, an erase enable signal EraseON, the system voltage VPP, and a ground voltage GND (e.g., the ground voltage GND may be 0V). In detail, the voltage generator 630 is implemented by a tri-state inverter, which includes a first voltage transistor TV1, a second voltage transistor TV2, and a third voltage transistor TV3. The first voltage transistor TV1 and the second voltage transistor TV2 are P-type transistors, and the third voltage transistor TV3 is N-type transistor. A first terminal (a source terminal) of the first voltage transistor TC1 receives the system voltage VPP, and a control terminal (a gate terminal) of the first voltage transistor TV1 receives the erase enable signal EraseON. A first terminal (a source terminal) of the second voltage transistor TV2 is coupled to the second terminal (a drain terminal) of the first voltage transistor TV1, and a control terminal (a gate terminal) of the second voltage transistor TV2 receives the global word line voltage GWL. A first terminal (a drain terminal) of the third voltage transistor TV3 is coupled to the second terminal (a drain terminal) of the second voltage transistor TV2 as an output terminal of the voltage generator 630. A second terminal (a source terminal) of the third voltage transistor TV3 receives the ground voltage GND, and a control terminal (a gate terminal) of the third voltage transistor TV3 receives the global word line voltage GWL.

When the erase enable signal EraseON is disabled for known that the erase operation is not performed, the first voltage transistor TV1 is conducted to the first terminal (the source terminal) and the second terminal (the drain terminal) of the first voltage transistor TV1, and the first signal Vpos is one of the system voltage VPP and the ground voltage GND according to the global word line voltage GWL. While the erase enable signal EraseON is disabled and the global word line voltage GWL is enabled (global word line voltage GWL is 2V for high voltage as the system voltage VPP), the third voltage transistor TV3 is conducted to it's first terminal (the drain terminal) and the second terminal (the source terminal) and the second voltage transistor TV2 is turned off, thus the first signal Vpos is the ground voltage GND (e.g., 0V). While the erase enable signal EraseON is disabled and the global word line voltage GWL is disabled (global word line voltage GWL is −10V for the negative voltage Vneg), the second voltage transistor TV2 is conducted to it's first terminal (the source terminal) and the second terminal (the drain terminal) and the third voltage transistor TV3 is turned off, thus the first signal Vpos is the system voltage VPP (e.g., 2V).

When the erase enable signal EraseON is enabled for the erase operation and the global word line voltage GWL is disabled (e.g., the global word line voltage GWL is −10V), the first voltage transistor TV1 and the third voltage transistor TV3 are turned off, and the first signal is the Hi-Z state. And, when the erase enable signal EraseON is enabled for the erase operation and the global word line voltage GWL is enabled (e.g., the global word line voltage GWL is 2V), the first voltage transistor TV1 and the second voltage transistor TV2 are turned off and the third voltage transistor TV3 is conducted to it's first terminal (the drain terminal) and the second terminal (the source terminal), and the first signal Vpos is coupled to the ground voltage GND (e.g., 0V).

Figure 7:
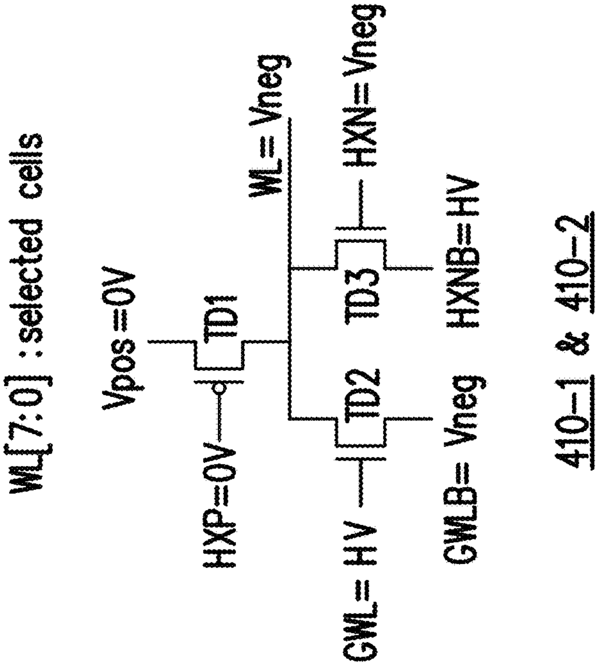
FIG. 7 is a schematic diagram illustrating signals of the word line drive circuit with the selected cell in the erase operation according to an embodiment of the present invention.

FIG. 7 is a schematic diagram illustrating signals of the word line drive circuit with the selected cell in the erase operation according to an embodiment of the present invention. It is assumed that corresponding cells of the word line voltages WL[0] and WL[7:1] of FIG. 4 are selected cells, and the first signal VPP in FIG. 6 is 0V based on the global word line decoder 420-1 in a situation of the enabled erase enable signal EraseON and the enabled global word line voltage GWL. The word line voltages WL[0] and WL[7:1] of FIG. 4 are provided by the word line drive circuits 410-1 and 410-2 of FIG. 4. In above situation of FIG. 7, the first control signal HXP is 0V, the global word line voltage GWL is a high voltage HV (e.g., 2V for the system voltage VPP), the revised word line voltage GWLB is the negative voltage Vneg (e.g., −10V), the second control signal HXN is the negative voltage Vneg (e.g., −10V), and the revised second control signal HXNB is the high voltage HV (e.g., 2V for the system voltage VPP). Thus, the output terminals of the word line drive circuits 410-1 and 410-2 are the negative voltage Vneg (e.g., −10V) of the first signal Vpos as the word line voltage WL.

Figure 8:
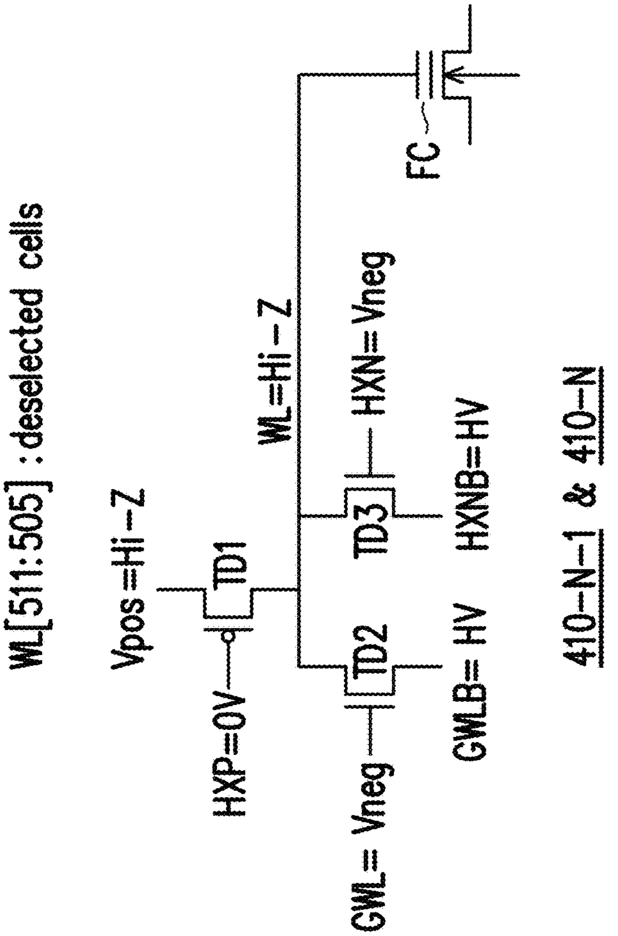
FIG. 8 is a schematic diagram illustrating signals of the word line drive circuit with the deselected cell in the erase operation according to an embodiment of the present invention.

FIG. 8 is a schematic diagram illustrating signals of the word line drive circuit with the deselected cell in the erase operation according to an embodiment of the present invention. It is assumed that corresponding cells of the word line voltages WL[504] and WL[511:505] of FIG. 4 are selected cells, and the first signal VPP in FIG. 6 is the Hi-Z state based on the global word line decoder 420-2 in a situation of the disabled erase enable signal EraseON and the enabled global word line voltage GWL. The word line voltages WL[504] and WL[511:505] of FIG. 4 are provided by the word line drive circuits 410-N-1 and 410-N of FIG. 4. In above situation of FIG. 8, the first control signal HXP is 0V, the global word line voltage GWL is the negative voltage (e.g., −10V), the revised word line voltage GWLB is the high voltage HV (e.g., 2V for the system voltage VPP), the second control signal HXN is the negative voltage Vneg (e.g., −10V), and the revised second control signal HXNB is the high voltage HV (e.g., 2V for the system voltage VPP). Thus, the output terminals of the word line drive circuits 410-N-1 and 410-N are the Hi-Z state of the first signal Vpos as the word line voltage WL. Hence, it has no current or carriers flow through the corresponding deselected cell(s) in the memory device while the word line voltage WL is the Hi-Z state in the erase operation.

Figure 9:
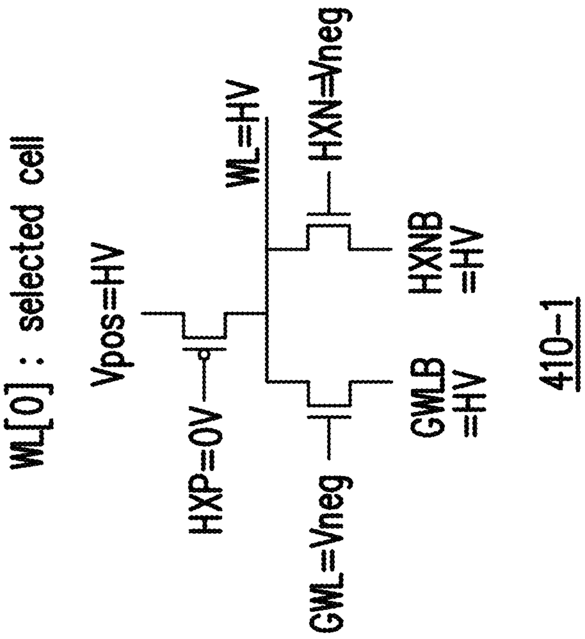
FIG. 9 is a schematic diagram illustrating signals of the word line drive circuit with the selected cell in a read operation and a program operation according to an embodiment of the present invention

FIG. 9 is a schematic diagram illustrating signals of the word line drive circuit with the selected cell in a read operation and a program operation according to an embodiment of the present invention. It is assumed that corresponding cell of the word line voltage WL[0] of FIG. 4 is selected cell for the read operation or the program operation, and the first signal VPP in FIG. 6 is the high voltage HV (e.g., 2V) based on the global word line decoder 420-2 in a situation of the disabled erase enable signal EraseON and the disabled global word line voltage GWL. The word line voltage WL[0] of FIG. 4 is provided by the word line drive circuit 410-1 of FIG. 4. In above situation of FIG. 9, the first control signal HXP is 0V, the global word line voltage GWL is the negative voltage Vneg (−10V), the revised word line voltage GWLB is the high voltage HV (2V), the second control signal HXN is the negative voltage Vneg (−10V), and the revised second control signal HXNB is the high voltage HV (2V). Thus, the output terminal of the word line drive circuit 410-1 is the high voltage HV (2V) as the word line voltage WL. Hence, the word line drive circuit 410-1 is operated normally in the read operation or the program operation.

Figure 10:
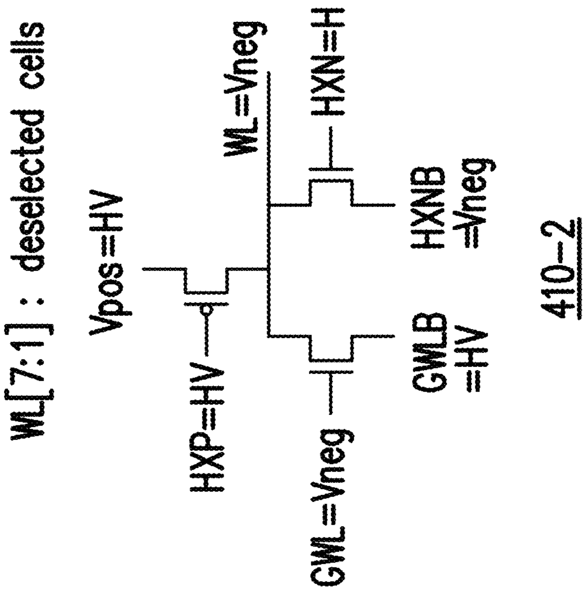
FIG. 10 and FIG. 11 are schematic diagrams illustrating signals of the word line drive circuit 410-2, 410-N-1 and 410-N with the deselected cells in the read operation and the program operation according to an embodiment of the present invention.
Figure 11:
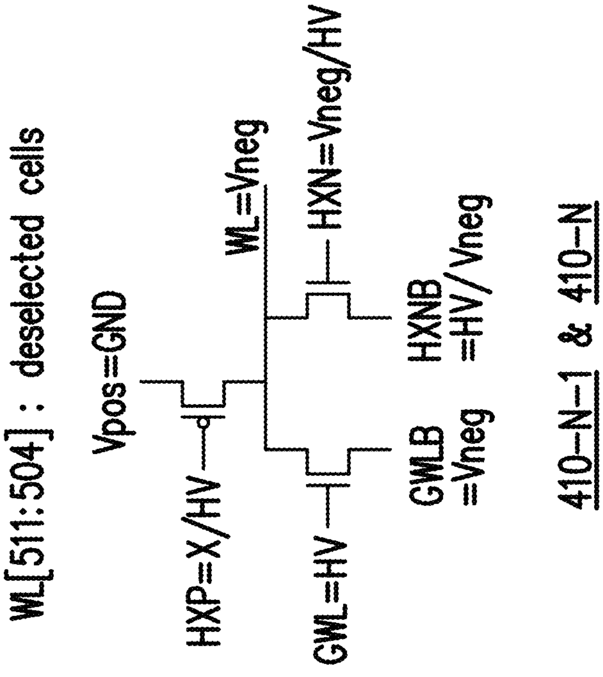

FIG. 10 and FIG. 11 are schematic diagrams illustrating signals of the word line drive circuit 410-2, 410-N-1 and 410-N with the deselected cells in the read operation and the program operation according to an embodiment of the present invention. In FIG. 10, it is assumed that corresponding cells of the word line voltages WL[7:1] of FIG. 4 are deselected cells for the read operation or the program operation, and the first signal VPP in FIG. 6 is the high voltage HV (2V) based on the global word line decoder 420-1 in a situation of the disabled erase enable signal EraseON and the disabled global word line voltage GWL. The word line voltages WL[7:1] of FIG. 4 are provided by the word line drive circuit 410-2 of FIG. 4. In above situation of FIG. 10, the first control signal HXP is the high voltage HV (2V), the global word line voltage GWL is the negative voltage Vneg (−10V), the revised word line voltage GWLB is the high voltage HV (2V), the second control signal HXN is the high voltage HV (2V), and the revised second control signal HXNB is the negative voltage Vneg (−10V). Thus, the output terminal of the word line drive circuit 410-1 is the negative voltage Vneg (−10V) as the word line voltage WL. Hence, the word line drive circuit 410-2 is operated normally in the read operation or the program operation.

In FIG. 11, it is assumed that corresponding cells of the word line voltages WL[504] and WL[511:505] of FIG. 4 are deselected cells for the read operation or the program operation, and the first signal VPP in FIG. 6 is the ground voltage GND (0V) based on the global word line decoder 420-2 in a situation of the disabled erase enable signal EraseON and the enabled global word line voltage GWL. The word line voltages WL[504] and WL[511:505] of FIG. 4 are provided by the word line drive circuits 410-N-1 and 410-N of FIG. 4. In above situation of FIG. 11, the first control signal HXP may be in a unknown state X or is the high voltage HV (2V), the global word line voltage GWL is the high voltage HV (2V), the revised word line voltage GWLB is the negative voltage Vneg (−10V), the second control signal HXN is the negative voltage Vneg (−10V) or the high voltage HV (2V), and the revised second control signal HXNB is the high voltage HV (2V) or the negative voltage Vneg (−10V). Thus, the output terminal of the word line drive circuit 410-1 is the negative voltage Vneg (−10V) as the word line voltage WL. Hence, the word line drive circuits 410-N-1 and 410-N are operated normally in the read operation or the program operation.

Figure 12:
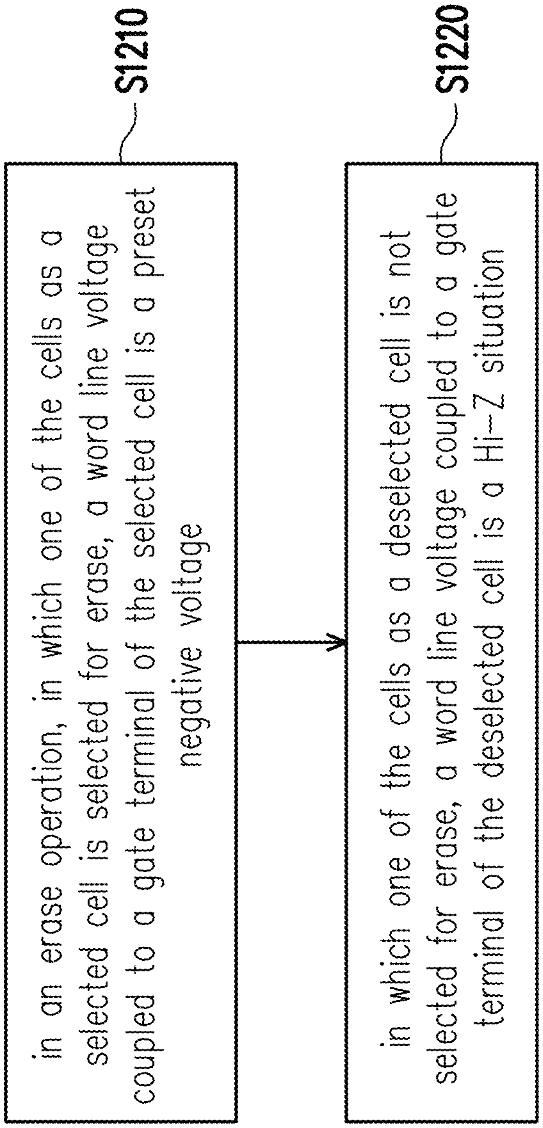
FIG. 12 is a flowchart illustrating a control method of a memory device according to an embodiment of the invention.

FIG. 12 is a flowchart illustrating a control method of a memory device according to an embodiment of the invention. The control method in FIG. 12 may implemented based on the memory device and the word line decoder 400 shown in FIG. 4. In step S1210, in an erase operation, in which one of the cells as a selected cell is selected for erase, a word line voltage coupled to a gate terminal of the selected cell is a preset negative voltage. And, in step S1220, in which one of the cells as a deselected cell is not selected for erase in the erase operation, a word line voltage coupled to a gate terminal of the deselected cell is a Hi-Z state. Detail of the steps in the control method may be referenced for the above embodiments.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A word line decoder, comprising:

a word line drive circuit, which comprises:

a first drive transistor, a first terminal of the first drive transistor receives a first signal, and a control terminal of the first drive transistor receives a first control signal; and a second drive transistor, a first terminal of the second drive transistor is coupled to a second terminal of the first drive transistor, a second terminal of the second drive transistor receives a revised global word line voltage, and a control terminal of the second drive transistor receives a global word line voltage, wherein the first terminal of the second drive transistor and the second terminal of the first drive transistor are coupled to a gate terminal of one of a plurality of cells in a memory array, wherein in an erase operation and the one of the plurality of cells is not selected for erase, the first control signal is enabled to enable the first drive transistor, the first signal is a Hi-Z state, and the first signal is coupled to the gate terminal of the one of the plurality of cells through the first drive transistor.

2. The word line decoder of claim 1, wherein the plurality of cells in the memory array has a common P-well layer, wherein in the erase operation and the one of the plurality of cells as a deselected cell is not selected for erase, no current flows through the deselected cell with the common P-well layer while the first signal is coupled to the gate terminal of the deselected cell.

3. The word line decoder of claim 1, further comprising:

a global word line decoder, which comprises:

a first inverter, an input terminal of the first inverter receives a global control signal, a system voltage terminal of the first inverter receives a system voltage, a ground terminal of the first inverter receives a negative voltage, and an output terminal of the first inverter provides the global word line voltage;

a second inverter, an input terminal of the second inverter receives the global word line voltage, a system voltage terminal of the second inverter receives the system voltage, a ground terminal of the second inverter receives the negative voltage, and an output terminal of the second inverter provides the revised global word line voltage; and a voltage generator, coupled to the first inverter, for providing the first signal according to the global word line voltage, an erase enable signal, the system voltage, and a ground voltage.

4. The word line decoder of claim 3, wherein the voltage generator comprises:

a first voltage transistor, a first terminal of the first voltage transistor receives the system voltage, and a control terminal of the first voltage transistor receives the erase enable signal;

a second voltage transistor, a first terminal of the second voltage transistor is coupled to the second terminal of the first voltage transistor, and a control terminal of the second voltage transistor receives the global word line voltage; and a third voltage transistor, a first terminal of the third voltage transistor is coupled to the second terminal of the second voltage transistor as an output terminal of the voltage generator, a second terminal of the third voltage transistor receives the ground voltage, and a control terminal of the third voltage transistor receives the global word line voltage.

5. The word line decoder of claim 4, wherein the first voltage transistor and the second voltage transistor are P-type transistors, and the third voltage transistor is a N-type transistor.

6. The word line decoder of claim 5, wherein when the erase enable signal is disabled, the first voltage transistor is conducted to the first terminal and the second terminal of the first voltage transistor, and the first signal is one of the system voltage and the ground voltage according to the global word line voltage.

7. The word line decoder of claim 5, wherein when the erase enable signal is enabled, the first voltage transistor and the third voltage transistor are turned off in a situation that the global word line voltage is disabled, and the first signal is the Hi-Z state.

8. The word line decoder of claim 5, wherein when the erase enable signal is enabled for the erase operation, the first voltage transistor and the second voltage transistor are turned off and the third voltage transistor is conducted to the first terminal and the second terminal of the third voltage transistor in a situation that the global word line voltage is enabled, and the first signal is coupled to the ground voltage.

9. The word line decoder of claim 1, wherein the word line drive circuit further comprising:

a third drive transistor, a first terminal of the third drive transistor is coupled to the second terminal of the first drive transistor, a control terminal of the third drive transistor receives a second control signal, and the second terminal of the third drive transistor receives a revised second control signal.

10. A control method of a memory device, wherein the memory device includes a plurality of cells, the method comprising:

in an erase operation, in which one of the cells as a selected cell is selected for erase, a word line voltage coupled to a gate terminal of the selected cell is a preset negative voltage;

in which one of the cells as a deselected cell is not selected for erase, a word line voltage coupled to a gate terminal of the deselected cell is a Hi-Z state; and not performing a refresh step of the erase operation for adjusting a threshold voltage distribution of the deselected cell.

11. The control method of claim 10, wherein the plurality of cells in the memory array has a common P-well layer, wherein the word line voltage coupled to the gate terminal of the deselected cell is the Hi-Z state, and no current flows through the deselected cell with the common P-well layer.

12. A word line drive circuit, comprising:

a first drive transistor, a first terminal of the first drive transistor receives a first signal, and a control terminal of the first drive transistor receives a first control signal; and a second drive transistor, a first terminal of the second drive transistor is coupled to a second terminal of the first drive transistor, a second terminal of the second drive transistor receives a revised global word line voltage, and a control terminal of the second drive transistor receives a global word line voltage, wherein the first terminal of the second drive transistor and the second terminal of the first drive transistor are coupled to a gate terminal of one of a plurality of cells in a memory array, wherein in an erase operation and the one of the plurality of cells is not selected for erase, the first control signal is enabled to enable the first drive transistor, the first signal is a Hi-Z state, and the first signal is coupled to the gate terminal of the one of the plurality of cells through the first drive transistor.

13. The word line drive circuit of claim 12, wherein the plurality of cells in the memory array has a common P-well layer, wherein in the erase operation and the one of the plurality of cells as a deselected cell is not selected for erase, no current flows through the deselected cell with the common P-well layer while the first signal is coupled to the gate terminal of the deselected cell.

14. The word line drive circuit of claim 12, further comprising:

a global word line decoder, which comprises:

a first inverter, an input terminal of the first inverter receives a global control signal, a system voltage terminal of the first inverter receives a system voltage, a ground terminal of the first inverter receives a negative voltage, and an output terminal of the first inverter provides the global word line voltage;

a second inverter, an input terminal of the second inverter receives the global word line voltage, a system voltage terminal of the second inverter receives the system voltage, a ground terminal of the second inverter receives the negative voltage, and an output terminal of the second inverter provides the revised global word line voltage; and a voltage generator, coupled to the first inverter, for providing the first signal according to the global word line voltage, an erase enable signal, the system voltage, and a ground voltage.

15. The word line drive circuit of claim 14, wherein the voltage generator comprises:

a first voltage transistor, a first terminal of the first voltage transistor receives the system voltage, and a control terminal of the first voltage transistor receives the erase enable signal;

a second voltage transistor, a first terminal of the second voltage transistor is coupled to the second terminal of the first voltage transistor, and a control terminal of the second voltage transistor receives the global word line voltage; and a third voltage transistor, a first terminal of the third voltage transistor is coupled to the second terminal of the second voltage transistor as an output terminal of the voltage generator, a second terminal of the third voltage transistor receives the ground voltage, and a control terminal of the third voltage transistor receives the global word line voltage.

16. The word line drive circuit of claim 15, wherein the first voltage transistor and the second voltage transistor are P-type transistors, and the third voltage transistor is a N-type transistor.

17. The word line drive circuit of claim 16, wherein when the erase enable signal is disabled, the first voltage transistor is conducted to the first terminal and the second terminal of the first voltage transistor, and the first signal is one of the system voltage and the ground voltage according to the global word line voltage.

18. The word line drive circuit of claim 16, wherein when the erase enable signal is enabled, the first voltage transistor and the third voltage transistor are turned off in a situation that the global word line voltage is disabled, and the first signal is the Hi-Z state.

19. The word line drive circuit of claim 16, wherein when the erase enable signal is enabled for the erase operation, the first voltage transistor and the second voltage transistor are turned off and the third voltage transistor is conducted to the first terminal and the second terminal of the third voltage transistor in a situation that the global word line voltage is enabled, and the first signal is coupled to the ground voltage.

* * * * *